(12) United States Patent
Waite et al.

(10) Patent No.: US 7,791,346 B2
(45) Date of Patent: Sep. 7, 2010

(54) DEVICE AND METHOD FOR TESTING AN ELECTRICAL POWER BRANCH CIRCUIT

(75) Inventors: Robert K. Waite, Holden, MA (US); Paul A. Keleher, Berlin, MA (US)

(73) Assignee: KO Instruments, Inc., Berlin, MA (US)

( * ) Notice: Subject to any disclaimer, the term of this patent is extended or adjusted under 35 U.S.C. 154(b) by 267 days.

(21) Appl. No.: 11/867,026

(22) Filed: Oct. 4, 2007

(65) Prior Publication Data
US 2008/0084213 A1 Apr. 10, 2008

Related U.S. Application Data

(60) Provisional application No. 60/955,509, filed on Aug. 13, 2007, provisional application No. 60/828,640, filed on Oct. 7, 2006, provisional application No. 60/870,127, filed on Dec. 15, 2006.

(51) Int. Cl.
*G01R 31/02* (2006.01)
(52) U.S. Cl. ........................ 324/424; 324/537
(58) Field of Classification Search ................ 324/424, 324/537; 361/42, 93.1, 94
See application file for complete search history.

(56) References Cited

U.S. PATENT DOCUMENTS

| 5,089,928 | A | * | 2/1992 | Durivage et al. ............... 361/94 |
| 5,272,438 | A | | 12/1993 | Stumme |
| 5,345,180 | A | * | 9/1994 | Maier et al. ................... 324/537 |
| 5,736,861 | A | | 4/1998 | Keleher et al. |
| 6,618,649 | B1 | | 9/2003 | Shilo |
| 6,815,955 | B1 | | 11/2004 | O'Neal, III |
| 6,850,072 | B1 | | 2/2005 | Stanisic |
| 6,960,916 | B2 | | 11/2005 | Walker |
| 6,963,203 | B2 | | 11/2005 | Stanisic et al. |
| 2004/0012393 | A1 | * | 1/2004 | Schmalz et al. ............. 324/424 |
| 2005/0001607 | A1 | | 1/2005 | Berland et al. |

* cited by examiner

*Primary Examiner*—Vincent Q Nguyen
(74) *Attorney, Agent, or Firm*—Brian M. Dingman; Mirick, O'Connell, DeMallie & Lougee, LLP

(57) ABSTRACT

A device and method for testing an electrical power branch circuit that includes hot, neutral and protective ground conductors and that carries alternating current. The device includes circuitry for determining the total available short-circuit current that can be carried by the neutral conductor, circuitry for determining the total available ground-fault current that can be carried by the protective ground conductor, and circuitry that, based on at least one of the determined short-circuit current and the determined ground-fault current, applies a short-circuit or ground-fault current to the electrical power branch circuit.

13 Claims, 2 Drawing Sheets

DEVICE AND METHOD FOR TESTING AN ELECTRICAL POWER BRANCH CIRCUIT

CROSS-REFERENCE TO RELATED APPLICATIONS

This application claims priority of Provisional applications 60/955,509 filed on Aug. 13, 2007, 60/828,640 filed on Oct. 7, 2006 and 60/870,127 filed on Dec. 15, 2006. The entire contents of these three provisional applications are incorporated herein by reference.

FIELD OF THE INVENTION

This invention relates to a device for testing circuits and circuit breakers.

BACKGROUND OF THE INVENTION

Standard circuit breakers of the type found in residential, institutional and light commercial settings are thermal/magnetic in operation. Requirement 250.4(A)(5) of the National Electrical Code (NEC) and the expectation of the electrical industry is that a circuit breaker should respond as rapidly as possible to a short-circuit or a ground-fault. The magnetic portion of the breaker is designed to react within 1 cycle on 60 Hz systems to the higher levels of overcurrent produced by parallel fault conditions such as short-circuits or ground-faults. Branch circuits, especially 15 and 20 A/120-volt circuits supplying general-purpose outlets in homes and buildings throughout North America and elsewhere, exhibit impedance characteristics that often limit the current available in a fault condition to relatively low levels by comparison to circuits of greater ampacity and/or voltage. This limitation results in available fault current at many outlets on these circuits that is insufficient to trigger the magnetic (1-cycle) response mechanism in the circuit breakers installed to protect them, leaving only the long-time (thermal) pick-up response of the circuit breaker as protection for parallel short-circuit or ground-fault overcurrent. This bi-metal thermal element is designed for inverse-time response to low-level overcurrents and may take up to several seconds to respond to a short-circuit or ground-fault. Because short-circuits or ground-faults have been shown in research to cause rapid ignition, the potential for an unsafe condition can result at an outlet at which the above condition exists.

At the present time the product listing requirement for standard circuit breakers (Underwriters' Laboratories, Inc. standard #489, Section 7) does not specify what level of overcurrent is required to engage the magnetic response of a thermal/magnetic circuit breaker that is intended to rapidly clear a short-circuit or ground-fault. Yet existing NEC requirement 250.4(A)(5) requires a circuit breaker to open as rapidly as possible in response to fault current. However, the product standard does not yet require an instantaneous response, and there is no test device that is capable of verifying in a practical and convenient manner that an installed equipment-grounding conductor and the circuit breaker of any branch circuit meet this requirement of the NEC, or that a given installed outlet will receive a rapid breaker response to a short-circuit or ground-fault. The lack of standardization of this particular breaker response in combination with a wide variation of available short-circuit and fault current at 120-volt outlets has resulted in a situation where there is a great disparity in short-circuit and ground-fault protection provided from premises to premises and even outlet to outlet in both the installed building infrastructure and in new buildings as they are wired today. The fact that this condition has perpetuated itself is in part a consequence of the lack of the necessary tools in the electrical service industry to verify compliance with 250.4(A)(5) of the NEC. As tools are developed that increase awareness of this condition, so will recognition of the need to test the instantaneous response of a circuit breaker.

U.S. Pat. Nos. 5,736,861 and 6,815,955 describe a method for measuring the impedance characteristics of branch circuits, and using the measurements to qualify the suitability of a circuit to safely sustain a short-circuit, and to calculate the maximum duration of a short-circuit of a given calculated magnitude that is inversely related to the measured branch impedance.

SUMMARY OF THE INVENTION

Accordingly, the invention comprises a test device and methodology that measures the impedance conditions at an installed outlet, and uses those measurements to determine and test whether the circuit breaker protecting the outlet will provide the instantaneous response expected.

One purpose of the present invention is to create a controlled short-circuit or ground-fault of predetermined amplitude with minimal power dissipation to the circuit. Another objective of this invention is to provide a test device and method that may be used to verify compliance of an equipment-grounding conductor and a circuit breaker with existing requirements of the NEC.

This invention features a circuit and circuit breaker tester device and method for use in evaluating the operational performance and safety of branch circuits in building electrical systems. The invention includes a means of calculating circuit and/or ground impedance, and available short-circuit and/or ground-fault current. These calculations are used to control the duration of a short-circuit or ground-fault subsequently applied by the test device across the conductors of a branch circuit or between the circuit conductors and the equipment-grounding conductor, to accomplish multiple purposes.

The invention may further comprise an overcurrent protective device that is rated to protect the circuit-under-test from sustained overcurrent in the event of a catastrophic failure of all safety-related components and control measures in the test circuit.

The invention may further comprise a zero-crossing detection system and method that eliminates the uncertainty due to voltage fluctuation found in conventional zero-crossing detectors.

The invention includes a means of measuring the total upstream line impedance at the outlet under test, and a means of using the measurement result to calculate the total available short-circuit current. The invention also includes a means of measuring the total upstream equipment-grounding conductor impedance, and a means of using the measurement to calculate the total available ground fault current. The invention also compares the hot-neutral impedance and the hot-ground impedance, or compares the hot-ground impedance and a predetermined value of impedance, as pre-qualification tests of the circuit. Following these measurements, and under conditions determined by these measurements, a short-circuit and/or ground-fault of controlled duration may be applied across the branch circuit, to accomplish several purposes described elsewhere herein.

The invention accomplishes the control of the duration of a short-circuit or ground-fault test. Testing the instantaneous response of a circuit breaker requires short-circuit or ground-fault closure of such short duration that can, depending on the impedance characteristics of the circuit-under-test, often be a fraction of a ½-cycle in duration. To achieve the level of precision required to accomplish such switching control, the precise zero-crossing point of an AC waveform is determined. Because standard techniques are only accurate to the +/−0.5V of the semiconductor junction used in the determination, the measured zero-crossing point is combined with the highly accurate frequency of the 60 Hz power line to predict a subsequent occurrence of the true zero voltage point with much greater accuracy than conventional zero-crossing detection methods.

The short-circuit and fault current paths employ a fuse or another overcurrent protective device that is rated to protect the circuit-under-test from prolonged exposure to the potential hazards associated with sustained exposure to short-circuit and/or fault current in the event of catastrophic failure of all controls and other overcurrent protection devices in the circuit-under-test.

This invention features a device for testing an electrical power branch circuit comprising hot, neutral and protective ground conductors and that carries alternating current (AC), the device comprising circuitry for determining the total available short-circuit current that can be carried by the neutral conductor, circuitry for determining the total available ground-fault current that can be carried by the protective ground conductor, and circuitry that, based on at least one of the determined short-circuit current and the determined ground-fault current, applies at least one of a short-circuit current and a ground-fault current to the electrical power branch circuit.

The circuitry that applies current to the electrical power branch circuit may apply the current for a controlled duration. The duration may be related to one or both of the determined short-circuit current and the determined ground-fault current. The device may further comprise circuitry for determining the zero crossing point of the AC waveform. The current may be applied beginning at a point related to the determined zero crossing point.

The device may further comprise an overcurrent protection device in series with the electrical power branch circuit that protects the circuit-under-test from sustained test overcurrent. The short-circuit current may be set at a predetermined value when the available short-circuit current exceeds the predetermined value. The ground-fault current may be set at a predetermined value when the available ground-fault current exceeds the predetermined value.

The short-circuit current and the ground-fault current may be applied simultaneously, or not, or only one or the other may be applied, as desired by the user or as called for in the test circumstances. The application of the currents may be terminated at an AC waveform zero crossing, or at another point in a half-cycle.

Also featured is a device for testing an electrical power branch circuit that carries alternating current (AC), the device comprising circuitry for determining the branch circuit impedance, circuitry for determining a test start point in the AC cycle, based at least in part on the determined impedance, and circuitry for applying a test current to the branch circuit at the test start point in an AC cycle.

The device may further comprise circuitry for determining the branch circuit available fault current. The determination of the branch circuit available fault current may be based on the determined branch circuit impedance and the branch circuit voltage. The test start point may be at a zero crossing point of the AC waveform, or at another point in the AC cycle. The circuitry for applying a test current to the branch circuit at the test start point in an AC cycle may terminate the test current at a zero crossing point of the AC waveform, or at another point in the AC waveform.

Also featured is a device for testing an electrical power branch circuit that carries alternating current (AC), the device comprising circuitry for determining the zero crossing point of the AC waveform based in part on the AC frequency, and circuitry for applying a test current to the branch circuit at a test start point in an AC cycle that is based on the determined zero crossing point. The zero crossing may be determined using a comparator that changes state at a non-zero voltage value. The zero crossing may be further determined based on the waveform period, and the amount of time between the state change at a known voltage and the next zero crossing. The test start point may be at a zero crossing point of the AC waveform, or at another point in the AC waveform.

The invention further features a device for testing an electrical power branch circuit comprising hot, neutral and protective ground conductors and that carries alternating current (AC), the device comprising circuitry for determining the impedance of the circuit comprising the hot and neutral conductors, circuitry for determining the impedance of the circuit comprising the hot and protective ground conductors, and circuitry for comparing the determined impedances for a purpose related to a branch circuit test. A test start point in the AC cycle may be determined based at least in part on the determined impedances. The device may further comprise circuitry for applying a test current to the branch circuit at the test start point in an AC cycle.

BRIEF DESCRIPTION OF THE DRAWINGS

Other objects, features and advantages will occur to those skilled in the art from the following description of the preferred embodiments, and the accompanying drawings, in which.

DESCRIPTION OF THE PREFERRED EMBODIMENTS

Figure 2:
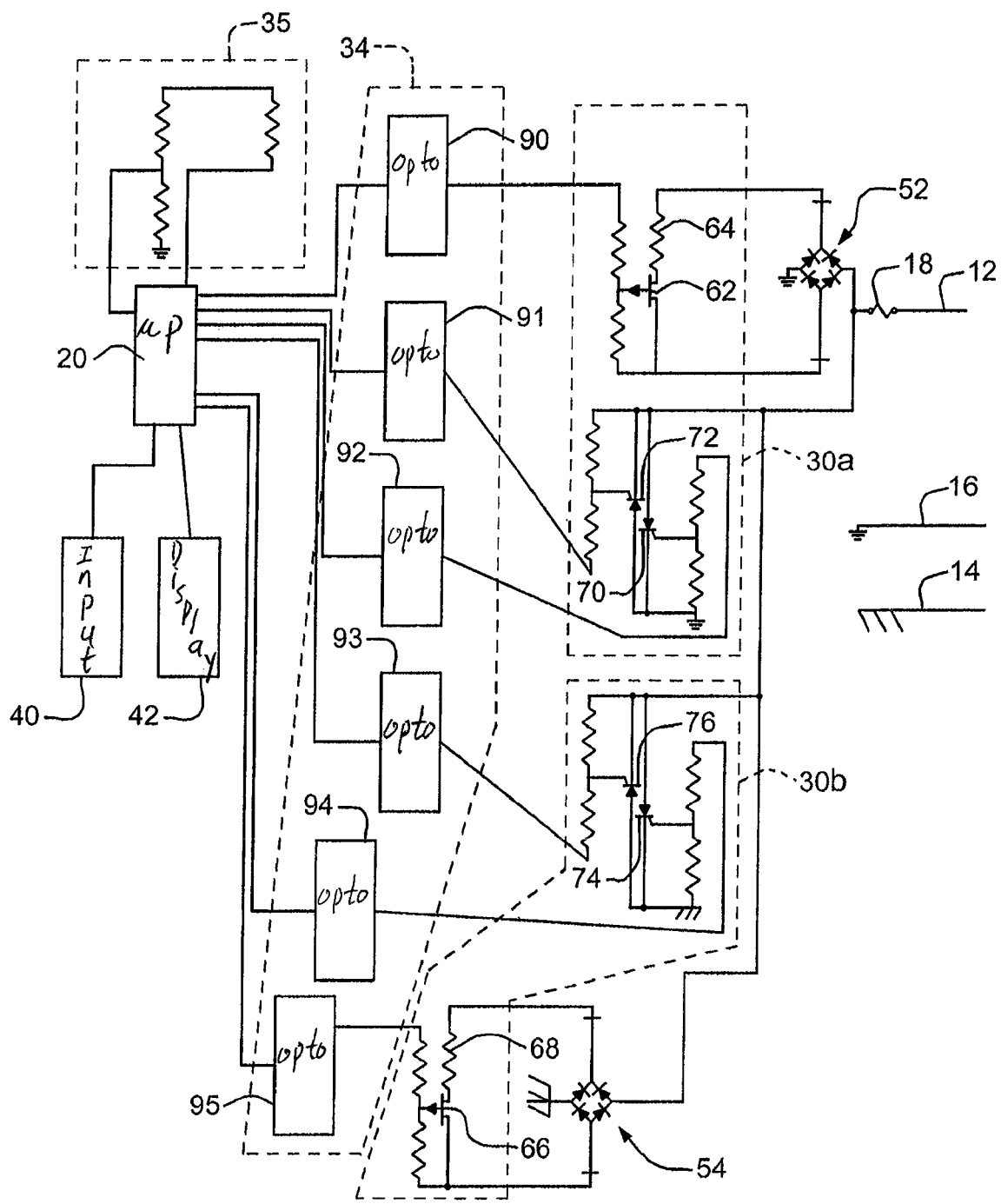
FIG. 2 is a partial schematic diagram showing the active elements of the embodiment of FIG. 1.

In a preferred embodiment, the inventive device and method is included as a part of a hand-held tester plugged into 120 VAC receptacle outlet or otherwise electrically connected to a 120 VAC outlet protected by a 15 or 20 Amp circuit breaker. In a preferred embodiment, the device is powered from the branch circuit, and has an internal battery (not shown in the drawings) for back-up power to maintain data integrity and continuity of operation when a breaker is tripped. The circuitry is protected by an overcurrent protective device (e.g., a fuse) with characteristics which allow one cycle bursts of predetermined current levels, but will operate to open the circuit before conductor overheating in the branch circuit-under-test occurs. For example, a 15 A fuse may be used in the preferred embodiment of FIG. 2.

Figure 1:
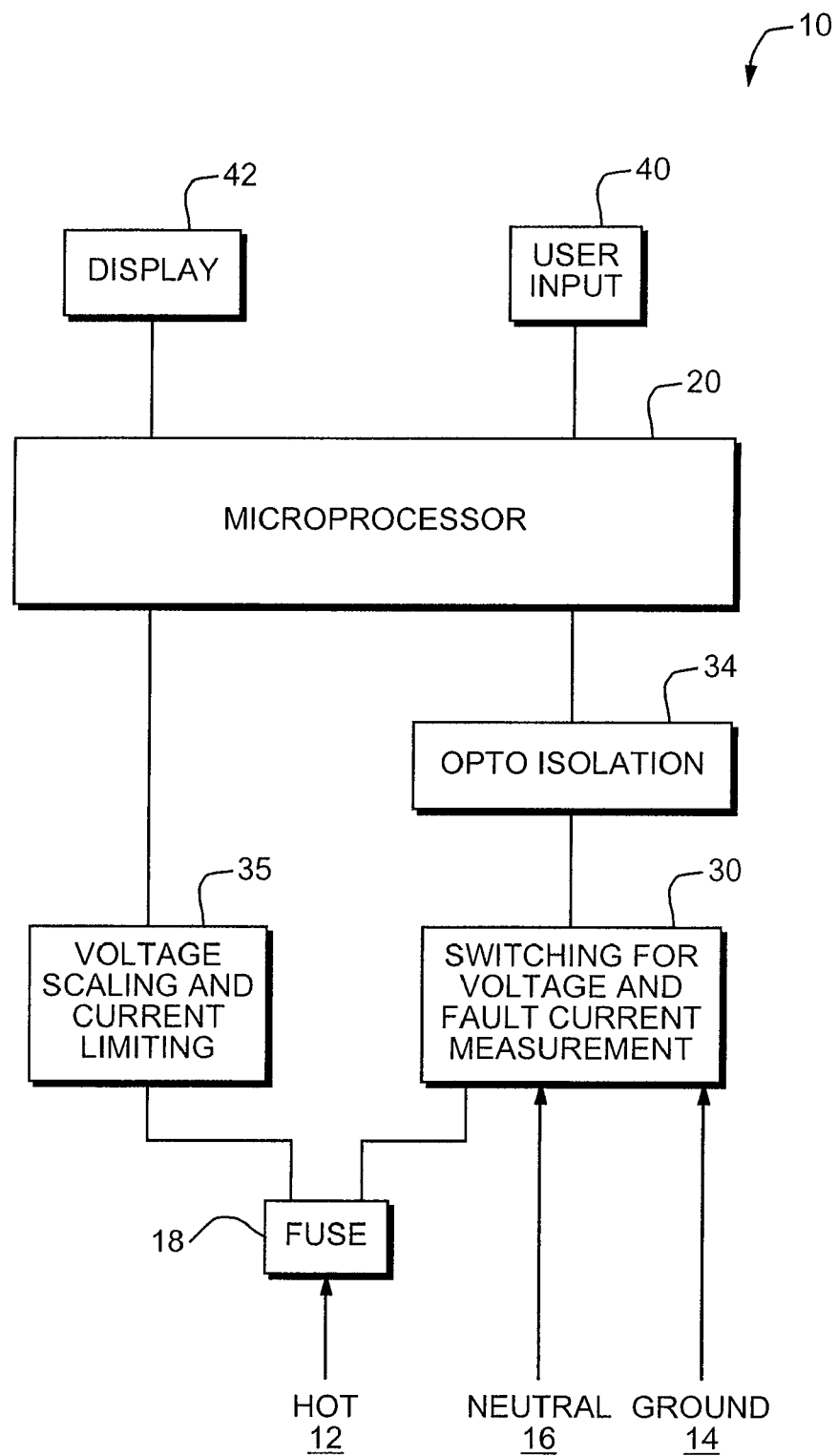
FIG. 1 is a functional block diagram of the preferred embodiment of the device of the invention, which can be used to accomplish the method of the invention.

FIG. 1 is a functional block diagram of an embodiment of the device of the invention that can also accomplish the method of the invention. System 10 makes circuit and circuit breaker measurements and tests through electrical connection to a typical three-conductor cable comprising hot, neutral and ground conductors 12, 16 and 14, respectively. Fuse 18 protects the circuitry of system 10. Voltage scaling and current limiting circuitry 35 supplies power to microprocessor 20, user input 40, and display 42, provides a voltage input to the comparator circuit inside microprocessor 20 that is involved in zero crossing detection, and provides a scaled version of the hot voltage to microprocessor 20. Optoisolation 34 provides switching, under control of microprocessor 20, for circuitry 30 that accomplishes switching for voltage and fault current measurement.

Line impedance is determined by measuring AC voltage, then applying a known load to that voltage and measuring the voltage under load. The change in voltage is used to calculate line impedance in a manner known to those skilled in the art. The calculated impedance is then used to calculate available fault (short-circuit and/or ground-fault) current.

The impedance of the circuit comprising the ungrounded ("hot") conductor 12 and grounded ("neutral") conductor 16 is determined as follows. See FIG. 2. The AC voltage between the hot and neutral conductors is full-wave rectified by diode bridge 52 and fed to a power Field Effect Transistor (FET) 62 of sufficient short-term current carrying capacity to handle the measurement load involved (up to 15 A). See the switching for voltage and fault current measurement circuitry 30a. An 8 Ohm 5 Watt 1% resistor 64 is wired in series with FET 62 across bridge 52 to limit the current to a known value. At a point in the AC waveform where the voltage is sufficient to generate a current large enough to generate an easily measurable voltage drop across the combined line impedance and the 8-ohm measurement resistor, a voltage measurement is taken by microprocessor 20 and recorded in memory (not shown). Using optoisolator 90 of optoisolator circuitry 34, under control of microprocessor 20 FET 62 is then turned on long enough for the voltage to stabilize, and the loaded line voltage is measured and recorded. FET 62 is then turned off and after waiting for the same brief interval for the voltage to stabilize, a second unloaded line voltage measurement is taken. The two unloaded line voltage measurements are averaged to give a representation of what the unloaded line voltage would have been at the time of the loading. The impedance of the line is then calculated by microprocessor 20 using standard circuit analysis techniques from knowledge of the voltage source and the voltage drop across the 8 ohm resistor and the line impedance. In the preferred embodiment this process is repeated 10 times and the results averaged to reduce the effects of line voltage fluctuations and extraneous noise.

In a similar manner, under control of microprocessor 20 optoisolator 95 is operated to connect FET 66 (of switching for voltage and fault current measurement circuitry 30b) between the ungrounded conductor 12 and the equipment-grounding conductor 14, and the impedance measurement described above is repeated for equipment-grounding conductor 14.

The results of the two impedance measurements described above are compared to each other and to a minimum current that will engage the magnetic response of the breaker. The comparative result, with interpretation such as an indication as to whether either current is insufficient to trip the breaker, with consideration that, if so indicated, a steel or other non-copper equipment grounding conductor path may be acceptable at lower rated currents, is provided by microprocessor 20 and displayed to the user as judgment as to whether the equipment-grounding conductor, even if made from different materials from that of the circuit conductors, is an Effective Fault-Current Path in compliance with 250.4(A)(5) of the NEC.

A pulse of available short-circuit and/or fault current, time-controlled based on the impedance measurements described herein, is generated to verify whether the outlet-under-test is in compliance with NEC 250.4(A)(5). In the preferred embodiment, User Input 40 is used to select one of several possible test functions requiring a test short-circuit, ground-fault or some combination of both. To accomplish the short-circuit test, SCRs 70 and 72, of sufficient short-term current-carrying capacity, are connected directly across the power line between the ungrounded and grounded conductors of the circuit. To accomplish the ground fault test, SCRs 74 and 76 are connected directly between the ungrounded conductor and the equipment-grounding conductor of the circuit.

When the user selects from user input device 40, microprocessor 20 measures the line voltage and line impedance and calculates the available fault current, all as described above. Microprocessor 20 also determines the voltage waveform zero crossing point with great accuracy. This is done as follows. Microprocessor 20 samples line voltage supplied by circuitry 35 into an accurate comparator microprocessor input that is set to change state when the voltage is at a particular non-zero level (2.5V in the example). As the peak voltage, and the waveform shape (sine wave) and period are known a priori, microprocessor 20 can very accurately determine the amount of time from the 2.5V measurement until the next zero crossing. This allows the system to be used to begin and/or end a fault-current test essentially exactly at a zero crossing point, or, since the zero crossing point is known, at any other point in a half cycle.

Microprocessor 20 then initiates a controlled fault current by firing the selected pair of SCRs through their associated optoisolators—optoisolators 91 and 92 for SCRs 70 and 72, and optoisolators 93 and 94 for SCRs 74 and 76. The SCRs are fired beginning at a predetermined point in the AC cycle that is precalculated by the above described impedance measurement and calculation, and ending either when the breaker trips or when the current half cycle ends, or at a point either before or after a zero crossing, as desired to achieve a desired test result.

The beginning point of application of the short-circuit or ground-fault is determined by measuring line impedance as described herein, and using the result to calculate the available short-circuit and/or ground-fault current at the outlet. If the calculated available short-circuit or fault current is greater than a predetermined value, the beginning point of application of the short-circuit or ground-fault is delayed. The duration of the delay is related to the magnitude of the calculated available current such that for any combination of current and time above a pre-determined threshold, the total power dissipated into the branch circuit by the short-circuit or ground-fault is constant for each test, or varied according to need for a given purpose. The desired delay can thus be determined by one skilled in the art.

The total available short-circuit and/or ground-fault current, and combined currents are calculated using the total impedance of the line, and the impedances of the neutral and/or equipment-ground conductors of the circuit. If the total calculated available current does not exceed a predetermined level as determined by the device manufacturer or a standards body, for example, a short-circuit or ground-fault is initiated at a true zero voltage point in a subsequent AC cycle, as determined by the method described above. If the total available short-circuit and/or ground-fault current exceeds the predetermined level, the application of the selected available current is preceded by a time delay that is begun at the true zero-voltage point, so that when the short-circuit and/or ground-fault is applied after the time delay, the current is controlled to the predetermined level. If neither the total available short-circuit nor ground-fault current exceeds the predetermined level, the application of the higher available current is initiated at a true zero voltage point, and the application of the lower available current is initiated at a point as determined above such that when the short-circuit and ground-faults are applied after the time delay, the current is controlled to the predetermined level. If the summation of available current from combining both short-circuit and ground-fault is less than the predetermined level, no test is performed and the user is so notified. The test ends either when the circuit breaker has tripped or the AC cycle ends.

In the preferred embodiment, depending on the result of the above-described impedance calculations both the available short-circuit and available ground-fault currents may be turned on or off at any point in the cycle either simultaneously or non-simultaneously to achieve a predetermined overcurrent for a specific purpose. If desired, the actual fault current can be measured, for example using a Hall-Effect sensor.

Non-limiting Example:

Assume a required breaker magnetic response-inducing current of 225 amps for a 15 A breaker. There are several cases:
  a) If the hot-neutral current is at least 225 A, the result is to short the hot-neutral for some time no greater than ½ cycle to produce an equivalent 225 A.
  b) If the hot-neutral current is less than 225 A, but the hot-equipment grounding conductor current is at least 225 A, the result is to short the hot-equipment grounding conductor for some time no greater than ½ cycle to produce an equivalent 225 A.
  c) If neither current is at least 225 A, but the calculated combination of the larger current applied for a full ½ cycle and the smaller current applied for all or part of the same ½ cycle exceeds 225 A, the result is to apply both as calculated.
  d) If neither current is at least 225 A, and the calculated combination of both applied for the full ½ cycle is less than 225 A, the result is to inform the user that the circuit current is insufficient, and do not run a test.

The particular types of and values of components and circuits described as part of a preferred embodiment are not limitations of the invention, but rather are exemplary of the invention, which is defined by the following claims. Other embodiments will occur to those skilled in the art and are within the scope of the claims.

What is claimed is:

1. A device that is temporarily connected to and tests an electrical power branch circuit comprising hot, neutral and protective ground conductors and that carries alternating current (AC), the device comprising:
    circuitry that measures the voltage and impedance of the branch circuit, and in response determines a short-circuit current that the branch circuit is capable of carrying, and a ground-fault current that the branch circuit is capable of carrying;
    circuitry that, based on at least one of the determined short-circuit current and the determined ground-fault current, applies at least one of a short-circuit current and a ground-fault current to the electrical power branch circuit; in which the circuitry that applies current to the electrical power branch circuit applies the current for a controlled duration; and
    circuitry for determining the zero crossing point of the AC waveform, in which the current is applied beginning at a point related to the determined zero crossing point.

2. The device of claim 1 in which the duration is related to one or both of the determined short-circuit current and the determined maximum ground-fault current.

3. The device of claim 1 further comprising an overcurrent protection device in series with the electrical power branch circuit that protects the circuit-under-test from sustained test overcurrent.

4. The device of claim 1 in which the short-circuit current that is applied is set at a predetermined value when the determined short-circuit current exceeds the predetermined value.

5. The device of claim 1 in which the ground-fault current that is applied is set at a predetermined value when the determined ground-fault current exceeds the predetermined value.

6. The device of claim 1 in which the short-circuit current and the ground-fault current are applied simultaneously.

7. The device of claim 6 in which the application of the currents is terminated at an AC waveform zero crossing.

8. The device of claim 1 in which the zero crossing is determined using a comparator that changes state at a non-zero voltage value.

9. The device of claim 8 in which the zero crossing is further determined based on the voltage waveform period as determined from the frequency, and the amount of time between the state change at a known voltage and the next or a subsequent zero crossing.

10. The device of claim 9 in which the test start point is not at a zero crossing point of the AC waveform.

11. The device of claim 9 in which the test start point is at a zero crossing point of the AC waveform.

12. The device of claim 9 in which the circuitry for applying a test current to the branch circuit at a test start point in an AC cycle terminates the test current at a zero crossing point of the AC waveform.

13. The device of claim 9 in which the circuitry for applying a test current to the branch circuit at a test start point in an AC cycle terminates the test current at a point of the AC waveform other than the zero crossing point.

* * * * *